(12) United States Patent
Yamaguchi et al.

(10) Patent No.: US 6,699,351 B2
(45) Date of Patent: Mar. 2, 2004

(54) ANISOTROPICALLY CONDUCTIVE ADHESIVE COMPOSITION AND ANISOTROPICALLY CONDUCTIVE ADHESIVE FILM FORMED FROM IT

(75) Inventors: Hiroaki Yamaguchi, Kanagawa (JP); Yuji Hiroshige, Tokyo (JP); Michiru Hata, Kanagawa (JP); Tetsu Kitamura, Kanagawa (JP)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 10/239,375

(22) PCT Filed: Mar. 7, 2001

(86) PCT No.: PCT/US01/07234

§ 371 (c)(1),
(2), (4) Date: Sep. 19, 2002

(87) PCT Pub. No.: WO01/72919

PCT Pub. Date: Oct. 4, 2001

(65) Prior Publication Data

US 2003/0051807 A1 Mar. 20, 2003

(30) Foreign Application Priority Data

Mar. 24, 2000 (JP) .......................................... 2000-88552

(51) Int. Cl.$^7$ ............................................... B32B 31/28
(52) U.S. Cl. ................................ 156/275.7; 156/275.5; 523/440; 523/442; 523/457; 523/458; 523/459
(58) Field of Search .......................... 156/275.5, 275.7; 523/440, 442, 457, 458, 459

(56) References Cited

U.S. PATENT DOCUMENTS

| | | | |
|---|---|---|---|
| 5,362,421 A | 11/1994 | Kropp et al. | |
| 5,667,893 A | 9/1997 | Kinzer et al. | |
| 5,863,970 A | 1/1999 | Ghoshal et al. | |
| 6,309,502 B1 | 10/2001 | Hiroshige et al. | |

FOREIGN PATENT DOCUMENTS

| | | |
|---|---|---|
| DE | 195 34 594 A1 | 3/1997 |
| DE | 196 48 283 A1 | 5/1998 |
| JP | 7-90237 | 4/1995 |
| JP | 8-511570 | 12/1996 |
| JP | 10-269853 | 10/1998 |
| JP | 10-273635 | 10/1998 |
| JP | 11-35903 | 2/1999 |
| JP | 11-60899 | 3/1999 |
| JP | 11-116778 | 4/1999 |

*Primary Examiner*—Robert Dawson
*Assistant Examiner*—D. Aylward
(74) *Attorney, Agent, or Firm*—Dean M. Harts

(57) ABSTRACT

To provide an anisotropically conductive adhesive composition that can be rapidly cured at a low temperature during thermocompression bonding and has a sufficiently long working life, while also exhibiting excellent mutual connection stability after connection between substrates. The anisotropically conductive adhesive composition comprises an epoxy resin comprising a cycloaliphatic epoxy resin and a glycidyl group-containing epoxy resin, an ultraviolet activatable cationic polymerization catalyst and a cationic polymerization retarder, and conductive particles.

20 Claims, No Drawings

ANISOTROPICALLY CONDUCTIVE ADHESIVE COMPOSITION AND ANISOTROPICALLY CONDUCTIVE ADHESIVE FILM FORMED FROM IT

FIELD OF THE INVENTION

The present invention relates to an anisotropically conductive adhesive composition and to an anisotropically conductive adhesive film formed from it.

BACKGROUND OF THE INVENTION

Anisotropically conductive adhesives that contain epoxy resin-based adhesives are known for adhesives used to bond circuit substrates, such as FPC (flexible printed circuits), or TAB (tape automated bondings) and PCB (printed circuit boards) or glass circuit boards, together while allowing electrical connection between the electrodes. The principal property demanded of such adhesives is the ability to harden within a short time at relatively low temperature so that the circuit substrate undergoes no thermal damage. An additional property is to provide a reliable electrical connection.

For example, Japanese Unexamined Patent Publication (Kokai) No. 7-90237, discloses a circuit connection material comprising conductive particles dispersed in an adhesive component, comprising an aromatic sulfonium salt added in a prescribed amount to a cationic polymerizable substance such as an epoxy resin. Also, Japanese Unexamined Patent Publication (Kokai) No. 10-273635 discloses a circuit bonding member comprising conductive particles and an adhesive composition the essential components of which are epoxidized polybutadiene, a naphthalene-based epoxy resin, an aromatic sulfonium salt and a phenoxy resin. The conductive adhesives disclosed in these publications are both described as being capable of thermocompression bonding within 20 seconds at 130° C. and within 20 seconds as 140° C. However, since the highly reactive curing agent and epoxy resin are stored in admixture, there is a risk of impaired shelf life at room temperature. Another problem is that the high temperature (about 80° C.) applied in the drying step during production of the adhesive film accelerates cationic polymerization. In order to avoid this, it is necessary to carry out the drying step for a longer period at low temperature, thus lowering production efficiency.

Other examples of anisotropically conductive adhesives are disclosed in Japanese Unexamined Patent Publication (Kokai) No. 11-35903 and Japanese Unexamined Patent Publication (Kokai) No. 10-269853, which employ an organic peroxide and a vinyl ester or the like, an acrylate, methacrylate or the like. According to the examples in Japanese Unexamined Patent Publication (Kokai) No. 11-35903, the disclosed adhesive can be thermocompression bonded within 15 seconds at 130° C. According to the examples in Japanese Unexamined Patent Publication (Kokai) No. 10-269853, its adhesive can be thermocompression bonded within 30 seconds at 160° C. These technologies, however, not only present the aforementioned problem of lower production efficiency due to the drying step, but also they employ a peroxide as a raw material, raising the concern of explosion occurring by contact with metals. Therefore, since the facilities for production must be strictly prescribed, manufacturing costs increase.

An additional technology for accomplishing thermocompression bonding at lower temperature is disclosed in National Publication No. 8-511570. That case disclosed an anisotropically conductive adhesive composition comprising a cationic polymerizable monomer such as a glycidyl epoxy resin; a thermoplastic resin; multicomponent thermal initiating agent comprising an organometallic complex cation, a stabilizing additive and a curing accelerator; and conductive particles. This publication states that the adhesive can harden rapidly at 120° C.

Another example is Japanese Unexamined Patent Publication (Kokai) No. 11-60899, which discloses a conductive epoxy resin composition comprising (a) a cycloaliphatic epoxy resin, (b) a diol, (c) a styrene-based thermoplastic elastomer with an epoxy group in the molecule, (d) an ultraviolet activatable cationic polymerization catalyst and (e) conductive particles at 1–50 parts by weight to 100 parts by weight of the cycloaliphatic epoxy resin. Also, Japanese Unexamined Patent Publication (Kokai) No. 11-116778 discloses a conductive epoxy resin composition comprising (a) a cycloaliphatic epoxy resin, (b) a tackifier with an aromatic ring in the molecule, (c) a styrene-based thermoplastic elastomer with an epoxy group in the molecule, (d) an ultraviolet activatable cationic polymerization catalyst and (e) conductive particles at 1–50 parts by weight to 100 parts by weight of the cycloaliphatic epoxy resin. These publications teach that their disclosed adhesives are capable of being cured within 30 seconds at temperatures of 70–120° C. and 70–150° C., respectively.

In the conductive adhesives disclosed in these publications, a cationic polymerization catalyst of a Lewis acid or its complex is highly reactive in combination with the cycloaliphatic epoxy resin, and therefore curing occurs rapidly; however, the high reactivity also results in the problem of a short shelf life in the case of ordinary cationic polymerization catalysts. For this reason, an "ultraviolet activatable cationic polymerization catalyst" is used which has low activity as a catalyst unless subjected to ultraviolet irradiation, and exhibits higher activity upon ultraviolet irradiation. Such conductive adhesives, however, produce cationic active species such as Lewis acids after ultraviolet irradiation which results in high reactivity at relatively low temperatures in combination with the cycloaliphatic epoxy resin. It is believed that these conductive adhesives have a short working life after ultraviolet irradiation.

SUMMARY OF THE INVENTION

It is therefore an object of the present invention to overcome these problems of the prior art and to provide an anisotropically conductive adhesive composition and an anisotropically conductive adhesive film that exhibit superior properties. Specifically, the invention provides an anisotropically conductive adhesive composition and an anisotropically conductive adhesive film formed using the composition simultaneously endowed with the properties that (1) the composition has a long shelf life at room temperature (for example, the composition remains usable for at least about 30 days), (2) the composition before activation can be heated at relatively high temperature, since its curing reaction does not yet proceed at about 80° C., and the resulting adhesive film can be produced more efficiently for a short time compared to the prior art, since drying process for the film formation can be shortened (3) the composition has a sufficiently long working life, which is defined as time length for which the composition can be left from activation by ultraviolet irradiation to thermocompression bonding, thus providing the sufficient time required for the thermocompression bonding procedure, which is preferably at least about 10 minutes, more preferably at least about 30 minutes and even more preferably at least about 60 minutes considering the maintenance time, etc. in the semiconductor device mounting step for actual use, (4) the composition rapidly cures at a low temperature of about 100 to about 130° C. during thermocompression bonding after ultraviolet activation, i.e. curability preferably within one minute, more preferably within about 30 seconds and even more preferably within about 10 seconds, and (5) the composition provides excellent connection stability after connection between substrates (for example, the resistance is not raised or remain the same, even after the high temperature/high humidity test as shown in table 1 of the working examples.).

"Anisotropically conductive adhesive composition" as used throughout the present specification refers to an adhesive composition capable of bonding two circuit substrates together, when the two circuit substrates are laminated together for electrical connection between conductors on the circuit substrates. Conductivity is exhibited in the direction normal to the substrate so as to provide electrical connection between conductors facing each other on the circuit substrates, but without exhibiting conductivity in the planar direction of the substrates so as to avoid shorting of adjacent circuits on the circuit substrates. In other words, the adhesive compositon exhibits anisotropic conductivity when bonded. Such adhesive compositions are usually used in the form of films, and an adhesive film formed from such an anisotropically conductive adhesive composition is called an "anisotropically conductive adhesive film". Anisotropic conductivity is a phenomenon wherein when an adhesive film is used to bond together two substrates by thermocompression bonding. The non-conductive adhesive components, which are those components other than the conductive particles, are fluidized and eliminated by the heat and pressure of thermocompression bonding, thereby providing electrical connection between the conductors on the substrates while no conductivity is exhibited in the planar direction of the substrates because of the presence of the non-conductive adhesive components.

According to the invention, there is provided an anisotropically conductive adhesive composition comprising an epoxy resin comprising a cycloaliphatic epoxy resin and a glycidyl group-containing epoxy resin, an ultraviolet activatable cationic polymerization catalyst and a cationic polymerization retarder, and conductive particles.

The invention further provides an anisotropically conductive adhesive film obtained by coating on to a support and drying a coating solution comprising such an anisotropically conductive adhesive composition with a further added thermoplastic elastomer or resin.

The composition has a long shelf life at room temperature (the composition remains usable for at least about 30 days). The composition also allows the drying step to be carried out at a relatively high temperature, about 80° C., during production of adhesive films, and can thus increase the production efficiency for adhesive films. The composition can also be rapidly cured at a low temperature of about 100 to about 130° C. during thermocompression bonding after activation with ultraviolet rays, and has a sufficiently long working life after activation until thermocompression bonding, thus providing the sufficient time necessary for the thermocompression bonding procedure. It also exhibits excellent connection stability after connection of substrates

DETAILED DESCRIPTION OF THE INVENTION

The anisotropically conductive adhesive composition of the invention is characterized by comprising as essential components thereof, an epoxy resin including (1) a cycloaliphatic epoxy resin and (2) a glycidyl group-containing epoxy resin, an ultraviolet activatable cationic polymerization catalyst, a cationic polymerization retarder, and conductive particles. The anisotropically conductive adhesive composition of the invention is usually used in the form of an adhesive film, in which case a thermoplastic elastomer or resin is added for formation of the film. The present invention will henceforth be explained in terms of its function, using an adhesive film for illustration.

The cycloaliphatic epoxy resin has the function of allowing rapid curing at low temperature, in combination with the ultraviolet activatable cationic polymerization catalyst. On the other hand, the glycidyl group-containing epoxy resin has the function of lengthening the working life of the adhesive film after ultraviolet activation, together with the cationic polymerization retarder. Additionally, the glycidyl group-containing epoxy resin has lower reactivity than the cycloaliphatic epoxy resin and has reactivity in a slightly higher temperature range. The ultraviolet activatable cationic polymerization catalyst is a compound that produces a Lewis acid or the like as a cationic active species by ultraviolet irradiation, and catalyzes an epoxy ring-opening reaction. The cationic polymerization retarder retards or inhibits cationic polymerization reaction by substituting a part of the cationic polymerization catalyst and by sequestering the Lewis acid or other cationic active species in the cationic polymerization, thereby extending the working life of the adhesive film.

In order to achieve satisfactory electrical connection between substrates using the anisotropically conductive adhesive film, it is necessary to adequately eliminate the non-conductive adhesive components from between the conductive particles and conductors on the circuit substrates by sufficient fluidization of those adhesive components by the heat and pressure of thermocompression bonding. The flow properties of the adhesive components during thermocompression bonding varies depending on the intrinsic viscosities of the resins in the adhesive and viscosity increase due to the gradually proceeding thermosetting reaction. A feature of the composition comprising a cycloaliphatic epoxy resin as the epoxy resin and comprising an ultraviolet activatable cationic polymerization catalyst is that it has high storability at room temperature, and remains usable for at least 30 days since it exhibits no catalytic function prior to activation by ultraviolet rays. However, once activated by ultraviolet rays, the composition undergoes thermosetting within a short time at low temperature. Because the thermosetting reaction proceeds rapidly after activation and viscosity increase occurs within a short time due to the thermosetting reaction, the thermocompression bonding must be carried out promptly. Addition of a cationic polymerization retarder can be considered for delaying the curing reaction. However, even when such a retarder is added, if the time until thermocompression bonding becomes extended by the time required for alignment of the circuit substrates, etc. after ultraviolet irradiation, the viscosity increase of the adhesive components due to the gradually proceeding thermosetting reaction will prevent sufficient removal of the adhesive components from between the conductive particles and the conductors on the circuit substrates, tending to result in a less stable electrical connection. On the other hand, when a glycidyl group-containing epoxy resin is included as an epoxy resin, the thermosetting reaction after ultraviolet irradiation occurs more gently thus extending the working life after activation, but it becomes necessary to increase the bonding temperature or lengthen the bonding time in order to achieve sufficient hardness for a satisfactory electrical connection.

Here, it has been demonstrated that the anisotropically conductive adhesive composition comprising an epoxy resin comprising both a cycloaliphatic epoxy resin and a glycidyl group-containing epoxy resin, an ultraviolet activatable cationic polymerization catalyst and a cationic polymerization retarder, as well as the anisotropically conductive adhesive film obtained therefrom, has a retarded viscosity increase after ultraviolet irradiation and a longer working life after activation because of the effect of the glycidyl group-containing epoxy resin and the cationic polymerization retarder, while the higher reactivity of the cycloaliphatic epoxy resin due to the combination of the cycloaliphatic epoxy resin with the ultraviolet activatable cationic polymerization catalyst provides adequate curing at low temperature and allows stabilized electrical connections.

Accordingly, the anisotropically conductive adhesive composition of the invention exhibits (1) a long shelf life at room temperature, so that the curing reaction does not proceed until activation by ultraviolet rays, (2) the composition before activation can be heated at relatively high temperature, since its curing reaction does not yet proceed at about 80° C., and the resulting adhesive film can be produced more efficiently for a short time compared to the prior art, since drying process for the film formation can be shortened, (3) a longer working life, preferably at least about 10 minutes, more preferably at least about 30 minutes and even more preferably at least about 60 minutes, at ordinary temperature even after activation by ultraviolet irradiation, thus allowing the thermocompression bonding procedure to be accomplished satisfactorily, (4) minimized deformation of materials by rapid thermocompression bonding (preferably within about one minute, more preferably within about 30 seconds and even more preferably within about 10 seconds) at a low temperature of about 100 to about 130° C. when electrical connections are established by thermocompression bonding of easily deformable materials, such as FPCs and TABs having polyester and polyimide polymer materials as basic materials or polycarbonate circuit boards and PCBs having glass-reinforced epoxy materials as basic materials, and (5) excellent mutual connectivity after connection between substrates.

According to one mode of the anisotropically conductive adhesive composition of the invention, it comprises an epoxy resin comprising a cycloaliphatic epoxy resin and a glycidyl group-containing epoxy resin, an ultraviolet activatable cationic polymerization catalyst and a cationic polymerization retarder, and conductive particles and the anisotropically conductive adhesive being used by thermocompression bonding after ultraviolet irradiation, and 1) it has a working life of at least about 10 minutes, the working life being defined as time length for which the composition can be left from activation by ultraviolet irradiation to thermocompression bonding and
2) it can be completely thermoset within about 60 seconds at a thermocompression bonding temperature of about 100 to about 130° C.

Each of the components will now be explained.

Cycloaliphatic Epoxy Resin

As mentioned above, the cycloaliphatic epoxy resin improves the rapid curability and low temperature curability of the adhesive composition. The combination of this component with the ultraviolet activatable cationic polymerization catalyst allows rapid curing at low temperature. Because of the low viscosity, it also acts to increase intimate contact between the composition and the substrate. The cycloaliphatic epoxy resin used for the invention is an epoxy resin with an average of at least two cycloaliphatic epoxy groups per molecule. As examples of cycloaliphatic epoxy resins there may be mentioned the following that have two epoxy groups in the molecule: vinylcyclohexene dioxide, 3,4-epoxycyclohexylmethyl-3,4-epoxycyclohexanecarboxylate, bis(3,4-epoxycyclohexyl)adipate and 2-(3,4-epoxycyclohexyl-5,5-spiro-3,4-epoxy)cyclohexane-meta-dioxane. Polyfunctional cycloaliphatic epoxy resins having 3, 4 or more epoxy groups in the molecule (for example, Epolide GT: available from Daicel Chemical Industries, Ltd.) may also be used.

The cycloaliphatic epoxy resin used for the invention has epoxy equivalents in the range of usually about 90 to about 500, preferably about 100 to about 400, more preferably about 120 to about 300 and most preferably about 210 to about 235. With fewer than about 90 epoxy equivalents, the toughness after thermosetting is reduced and the adhesive strength is lower, which may reduce the connection reliability. With more than about 500 epoxy equivalents, the viscosity of the entire system is excessively increased, the flow properties are poor during thermocompression bonding or the reactivity is lowered, which may reduce the connection reliability.

Glycidyl Group-Containing Epoxy Resin

As mentioned above, with an action of a cationic polymerization retarder, the glycidyl group-containing epoxy resin has the function of lengthening the working life of the composition after ultraviolet activation. It has lower reactivity than the cycloaliphatic epoxy resin while having a reactivity in a slightly higher temperature range. When using a composition comprising only the cycloaliphatic epoxy resin with no glycidyl group-containing epoxy resin, the curing reaction tends to proceed even at lower temperatures near room temperature, presenting the drawback of shorter working life after activation by ultraviolet irradiation. Thus, as explained above, when the time until thermocompression bonding is extended by the time required for alignment of the circuit substrates, etc., the viscosity increase of the composition due to the thermosetting reaction prevents adequate elimination of the adhesive components between the conductive particles and the conductor on each circuit substrate, thus tending to give an unstable electrical connection. The glycidyl group-containing epoxy resin compensates for this drawback of such cycloaliphatic epoxy resins. The glycidyl group-containing epoxy resin used is an epoxy resin with an average of at least two glycidyl groups in the molecule. As examples of glycidyl group-containing epoxy resins to be used for the invention there may be mentioned bisphenol A-type epoxy resins synthesized from bisphenol A and epichlorohydrin, low-viscosity bisphenol F-type epoxy resins, polyfunctional phenol-novolac epoxy resins, ortho-cresol epoxy resins and the like. Glycidyl ester-type epoxy resins such as glycidyl hexahydrophthalate ester may also be used. However, they are limited to epoxy resins having no cationic polymerization-inhibiting groups, such as amines or sulfur- or phosphorous-containing groups.

The glycidyl-containing epoxy resin used for the invention has epoxy equivalents in the range of usually about 170 to about 5500, preferably about 170 to about 1000, more preferably about 170 to about 500 and most preferably about 175 to about 210. With fewer than about 170 epoxy equivalents, the toughness after thermosetting may be reduced and the adhesive strength lowered. With more than about 5500 epoxy equivalents, the viscosity of the entire system is excessively increased, the flow properties are poor during thermocompression bonding or the reactivity is lowered, such that the connection reliability may be reduced.

Mixing Ratio for Cycloaliphatic Epoxy Resin and Glycidyl Group-Containing Epoxy Resin The cycloaliphatic epoxy resin and glycidyl group-containing epoxy resin provide a satisfactory balance for the properties of the composition. Specifically, it is possible to provide a composition satisfactorily exhibiting both the low-temperature rapid curability of the cycloaliphatic epoxy resin and the long shelf life at room temperature of the glycidyl group-containing epoxy resin. The cycloaliphatic epoxy resin to glycidyl group-containing epoxy resin weight ratio is usually about 20:80 to abut 98:2, preferably about 40:60 to about 94:6, more preferably about 50:50 to about 90:10 and most preferably about 50:50 to about 80:20. If an amount of the cycloaliphatic epoxy resin is less than about 20% based on the total amount of the cycloaliphatic epoxy resin and the glycidyl group-containing epoxy resin, the curing properties at low temperature may be reduced and the adhesive strength and connection reliability may be inadequate. If an amount of the cycloaliphatic epoxy resin is greater than about 98%, the curing reaction may be promoted even at near room temperature, thus shortening the working life after ultraviolet irradiation.

Ultraviolet Activatable Cationic Polymerization Catalyst

The ultraviolet activatable cationic polymerization catalyst is a compound that catalyzes an epoxy ring-opening reaction by producing a cationic active species such as a Lewis acid by ultraviolet irradiation. As examples of such polymerization catalysts there may be mentioned allyldiazonium salts, diallyliodonium salts, triallylsulfonium salts, triallylselenium salts, iron-arene complexes, and the like. Iron-arene complexes are particularly preferred because of their thermal stability, and specifically there may be mentioned xylene-cyclopentadienyl iron (II) hexafluoroantimonate, cumene-cyclopentadienyl iron (II) hexafluorophosphate and xylene-cyclopentadienyl iron (II)-tris (trifluoromethylsulfonyl) methanide.

The ultraviolet activatable cationic polymerization catalyst used for the invention is used at usually about 0.05 to about 10.0 parts by weight, preferably about 0.075 to about 7.0 parts by weight, more preferably about 0.1 to about 4.0 parts by weight and most preferably about 1.0 to about 2.5 parts by weight, with respect to 100 parts by weight of the epoxy resin. If the amount is smaller than about 0.05 parts by weight, the curing properties at low temperature may be reduced and the adhesive strength and connection reliability may be inadequate. If the amount is greater than about 10.0 parts by weight, the curing reaction may be promoted even at near room temperature, and the shelf life at room temperature may be reduced.

Cationic Polymerization Retarder

The cationic polymerization retarder retards or inhibits the cationic polymerization reaction by substituting a part of the cationic polymerization catalyst and by sequestering the Lewis acid or other cationic active species in the cationic polymerization. Specifically there may be mentioned crown esters such as 15-crown-5, 1,10-phenanthroline and its derivatives, toluidines such as N,N-diethyl-meta-toluidine, phosphines such as triphenylphosphine, and triazines, etc.

The cationic polymerization retarder used for the invention is used at usually about 0.01 to about 10.0 equivalents, preferably about 0.05 to about 5.0 equivalents, more preferably about 0.10 to about 3.0 equivalents and most preferably about 0.4 to about 2.0 equivalents, with respect to the ultraviolet activatable cationic polymerization catalyst. If the cationic polymerization retarder is present at greater than about 10.0 equivalents, the curing properties at low temperature may be reduced and the adhesive strength and connection reliability may be inadequate, while if it is present at less than about 0.05 equivalents, the curing reaction may be promoted even at near room temperature, and the shelf life at room temperature may therefore be reduced.

Conductive Particles

The conductive particles used may be conductive particles such as carbon particles or metal particles of silver, copper, nickel, gold, tin, zinc, platinum, palladium, iron, tungsten, molybdenum, solder or the like, or particles prepared by covering the surface of these particles with a conductive coating of a metal or the like. It is also possible to use non-conductive particles of a polymer such as polyethylene, polystyrene, phenol resin, epoxy resin, acryl resin or benzoguanamine resin, or glass beads, silica, graphite or a ceramic, whose surfaces have been covered with a conductive coating of a metal or the like.

The mean particle size of the conductive particles used may vary depending on the electrode width and the spacing between the adjacent electrodes used for connection. For example, if the electrode width is 50 $\mu$m and the spacing between adjacent electrodes is 50 $\mu$m (i.e., the electrode pitch is 100 $\mu$m), a mean particle size of about 3 to about 20 $\mu$m is appropriate. By using an anisotropically conductive adhesive composition in which are dispersed conductive particles with a mean particle size in this range, it is possible to achieve fully satisfactory conductive characteristics while also adequately preventing short circuiting between adjacent electrodes. In most cases, since the pitch of the electrodes used for connection between the two circuit substrates will be from about 50 to about 1000 $\mu$m, the mean particle size of the conductive particles is preferably in the range of about 2 to about 40 $\mu$m. If they are smaller than about 2 $\mu$m, they may be buried in pits in the electrode surface thus losing their function as conductive particles, and if they are larger about 40 $\mu$m they may tend to produce short circuiting between adjacent electrodes.

The amount of the conductive particles added may vary depending on the area of the electrodes used and the mean particle size of the conductive particles. A satisfactory connection can usually be achieved with a few (for example, about 2 to about 10) conductive particles present per electrode. For even lower electrical resistance, the conductive particles may be included in the composition at about 10 to about 300 per electrode. If a high pressure is to be applied for the thermocompression bonding, the number of conductive particles on each electrode may be increased to about 300 to about 1000, and the pressure may be evenly distributed to achieve a satisfactory connection.

The amount of conductive particles with respect to the total volume of the composition minus the conductive particles is usually about 0.1 to about 30% by volume, preferably about 0.5 to about 10% by volume and more preferably about 1 to about 5% by volume. If the amount is less than about 0.1% by volume, there may be a greater probability of the conductive particles being absent on the electrode when connected, thus increasing the risk of lower connection reliability. If the amount is greater than about 30% by volume, short circuiting between adjacent electrodes may tend to occur.

Thermoplastic Elastomer or Resin

The thermoplastic elastomer or resin is a component that is included in the composition when necessary, and particularly it is included when the composition is to be used as an anisotropically conductive adhesive film. The thermoplastic elastomer or resin increases the film formability of the adhesive film while also enhancing the impact resistance of the resulting adhesive film and alleviating residual internal stress produced by the curing reaction, for improved bond reliability. The type of polymer compound commonly known as a thermoplastic elastomer is composed of a hard segment which is a confined phase at below a certain temperature and a soft segment that expresses rubber elasticity. Such elastomers include styrene-based thermoplastic elastomers, styrene-based elastomers which are block copolymers including, for example, a styrene unit in the hard segment and a polybutadiene unit or polyisoprene unit in the soft segment. As typical examples there may be mentioned styrene-butadiene-styrene block copolymer (SBS), styrene-isoprene-styrene block copolymer (SIS), as well as styrene-(ethylene-butylene)-styrene block copolymer (SEBS), wherein the diene component in the soft segment is hydrogenated, and styrene-(ethylene-propylene)-styrene block copolymer (SEPS). There may also be used styrene-based thermoplastic elastomers with reactive groups, such as elastomers of the type which are epoxy-modified by glycidyl methacrylate, or elastomers of type in which the unsaturated bond of a conjugated diene is epoxidized. With such elastomers having reactive groups, the high polarity of the reactive groups increases the compatibility with the epoxy resin so that the range of formulation with epoxy resins is widened, while its incorporation into a crosslinked structure by crosslinking reaction with the epoxy resin can improve the bonding reliability after curing due to the heat and humidity resistance. An example of an epoxidized styrene-based elastomer is Epofriend A1020 (Daicel Chemical Industries, Ltd.). In the present invention, a thermoplastic resin may also be used instead of a thermoplastic elastomer. Because the thermoplastic resin must be eliminated by fluidization during thermocompression bonding of the adhesive film in order to ensure a satisfactory electrical connection between the conductors on the bonded substrates, it is limited to a resin with a Tg of no higher than the thermocompression bonding temperature (for example, about 100 to about 130° C.). Such resins include, for example, polystyrene resins.

When using a thermoplastic elastomer or resin that is used when necessary for the invention, it is added usually at about 10 to about 900 parts by weight, preferably about 20 to about 500 parts by weight, more preferably about 30 to about 200 parts by weight and most preferably about 40 to about 100 parts by weight with respect to 100 parts by weight of the epoxy resin. If added at less than about 10 parts by weight the film formability of the composition may be reduced, and if added at greater than about 900 parts by weight the flow properties of the composition as a whole at low temperature may be reduced to the point of poor contact when the conductive particles and the circuit substrate are bonded, and may result in increased electrical resistance or lower connection reliability, and sometimes lower bonding strength.

Other Additives

The anisotropically conductive adhesive composition of the invention may also contain an added cationic polymerization reaction accelerator in addition to the components mentioned above. Addition of a reaction accelerator can further improve the low temperature curability and rapid curing property. An example of such a reaction accelerator is di-tert-butyloxalate. The reaction accelerator is added in an amount in the range of usually about 0.01 to about 5 parts by weight, preferably about 0.05 to about 3 parts by weight and more preferably about 0.1 to about 2 parts by weight with respect to 100 parts by weight of the cycloaliphatic epoxy resin and glycidyl group-containing epoxy resin. For increased bonding between the circuit substrate and the adhesive composition, there may also be included a coupling agent, for example a silane coupling agent such as γ-glycidoxypropyltrimethoxysilane.

Other additives such as antioxidants (for example, hindered phenol-based antioxidants), diols (for example, bis(phenoxyethanol)fluorene), chain transfer agents, sensitizers, tackifiers, thermoplastic resins, fillers, flow modifier, plasticizers, antifoaming agents and the like may also be added so long as the effect of the invention is not impeded.

Method for Production of Anisotropically Conductive Adhesive Film

The anisotropically conductive adhesive film may be obtained by preparing a coating solution comprising the aforementioned anisotropically conductive adhesive composition in an appropriate solvent such as tetrahydrofuran (THF), using appropriate coating means such as a knife coater or the like to coat it onto a support such as a polymer film, and then drying the coated film. The drying is carried out at a low temperature at which the solvent evaporates. However, the adhesive composition of the invention is stable without undergoing curing reaction even at higher temperatures of about 80° C. Consequently, the drying may be carried out under increasing temperature so long as the curing reaction is not promoted, and this can improve working efficiency. The thickness of the formed adhesive film is about 5 to about 100 $\mu$m in order to avoid gaps between connections when the circuit substrates are connected together by thermocompression bonding, and to allow the necessary and sufficient packing.

Electrical Connection Method for Circuit Substrates

A method will now be explained for electrical connection of conductors provided on the surfaces of two substrates (a first substrate and a second substrate). This method is substantially the same as the conventional method, except for the activation procedure by ultraviolet irradiation.

First, the conductive adhesive film is positioned in contact with the conductor of the first substrate, and the adhesive film is exposed to ultraviolet irradiation. This step is convenient for preliminary fixing of the substrate and the adhesive film when the surface of the adhesive film prior to curing has tackiness. When one side of the adhesive film is covered with a support that is transparent to ultraviolet rays, ultraviolet irradiation can be accomplished through the support. On the other hand, when the support absorbs ultraviolet rays the ultraviolet irradiation is performed after releasing the support from the adhesive film. The ultraviolet irradiation is usually performed using a high-pressure mercury lamp, and the irradiation dose is usually adjusted to about 100 to about 10,000 mJ/cm$^2$, as a dose sufficient for activation of the ultraviolet activatable cationic polymerization catalyst.

Next, the second substrate is positioned with the conductor of that substrate in contact with the activated adhesive film, and thermocompression bonding is accomplished at a temperature of about 100 to about 130° C., for example, about 120° C. The working life from activation to thermocompression bonding is usually at least abot 10 minutes, preferably at least about 30 minutes and more preferably at least about 60 minutes. The thermocompression bonding can be carried out with an iron, a heater block or a heated roll. The bonding pressure is appropriately selected so as to achieve adequate electrical connection after bonding. The pressure applied is usually in the range of about 1 to about 5 MPa. A bonding time of about 10 seconds is usually sufficient, but there is usually no problem in terms of adhesive performance even with a bonding time of one minute or longer.

EXAMPLES

The present invention will now be explained in further detail by way of examples. It is to be understood, however, that the invention is in no way restricted by these examples.

Example 1

(1) Preparation of Anisotropically Conductive Adhesive Composition

After mixing 4 g of the cycloaliphatic resin "Epolide GT401" (product name of Daicel Chemical Industries, Ltd.; epoxy equivalents=291), 1 g of the glycidyl group-containing epoxy resin "Epikote 154" (product name of Yuka Shell Epoxy, Ltd.; epoxy equivalents=178) and 5 g of the styrene-butadiene-styrene block copolymer "Epofriend A1020" (product name of Daicel Chemical Industries, Ltd.;

epoxy equivalents=510) with 12 g of tetrahydrofuran (THF), the mixture was stirred to uniformity. The conductive particles (gold-plated nickel particles, mean particle size of approximately 6 μm) were added in an amount of 3% by volume of a final solid, and stirring was continued until the conductive particles were thoroughly dispersed to obtain a dispersion. Separately, 0.072 g of the ultraviolet activatable cationic polymerization catalyst "Irgacure 261" (product name of Nippon Ciba Geigy, Ltd.; cumene-cyclopentadienyl iron hexafluorophosphate), 0.022 g of the cationic polymerization retarder "N,N-diethyl-m-toluidine", 0.2 g of the silane coupling agent "A187" (product name of Nippon Unicar Co., Ltd.; γ-glycidoxypropyltrimethoxysilane), 0.066 g of di-tert-butyloxalate (reaction promotor) and 0.6 g of methyl ethyl ketone (MEK) were combined and stirred to uniformity, and this mixture was added to and stirred with the aforementioned dispersion to obtain an anisotropically conductive adhesive composition.

(2) Fabrication of Anisotropically Conductive Adhesive Film

The dispersion obtained in this manner was coated onto a silicon-treated polyester film using a knife coater, and dried for 5 minutes in air at 80° C. to obtain an anisotropically conductive adhesive film with a thickness of 40 μm.

(3) Fabrication of Connection Test Strip for Circuit Substrate

An anisotropically conductive adhesive film with a width of 3 mm and a length of about 4 cm was applied onto a printed circuit board (PCB) having a construction with 196 gold-plated copper wires with a thickness of 35 μm, a conductor width of 200 μm and a pitch between conductors of 400 μm on a 0.6 mm thick FR4 glass epoxy substrate and then thermocompression bonding was carried out at 40° C. for 3 seconds at a pressure of 1.4 MPa and the polyester film was released (preliminary bonding).

The surface of the anisotropically conductive adhesive film was air-cooled so as to avoid heating to a thermosetting-promoting temperature while being exposed for 15 seconds to ultraviolet rays with a center wavelength of 365 nm and an intensity of 400 mW/cm$^2$ (ultraviolet activation). The surface temperature of the anisotropically conductive adhesive film during the ultraviolet irradiation was a maximum of 30° C. The ultraviolet irradiation apparatus used was an L5662-01 spot light source with a mercury-xenon lamp as the light source, having mounted thereon an E6255 direct-ray uniform exposure unit and an A6562 UV transmitting filter (both products of Hamamatsu Photonics, KK.).

A flexible printed circuit (FPC) having a construction with 196 tin-plated copper wires with a thickness of 18 μm, a conductor width of 200 μm and a pitch between conductors of 400 μm was aligned on a 75-μm thick polyimide film and affixed onto the anisotropically conductive adhesive film that had been subjected to preliminary bonding.

The anisotropically conductive film portion thereof was subjected to thermocompression bonding at 120° C. for 10 seconds under 3.0 MPa pressure to obtain a circuit connection test strip (main bonding).

(4) Electrical Resistance Test and Heat/Humidity Resistance Test (4-1) Bonding Immediately After Ultraviolet Activation The electrical resistance between the PCB and the FPC with the circuit connection test strip subjected to main bonding immediately after ultraviolet irradiation was measured using a digital multimeter, and the maximum values are shown in Table 1 (in the row: "Normal", "Immediate after bonding"). After allowing the test strip to stand for 240 hours in an atmosphere at 85° C./85% RH (relative humidity), the electrical resistance was measured in the same manner and the heat/humidity resistance of the test strip (connection reliability) was evaluated (in the row: "Normal", "85° C./85% RH" in Table 1).

(4-2) Bonding After Lapse of 60 Minutes from Ultraviolet Activation

A test strip subjected to main bonding after standing for 60 minutes in an atmosphere at 30° C. and 70% RH after ultraviolet irradiation was tested in the same manner as above. The results are shown in Table 1 in the rows: "RT60 minutes", "Immediate after bonding" and "RT60 minutes", "85° C.-85% RH".

Example 2

The test conducted in Example 1 was repeated, but with the amount of cationic polymerization retarder changed as shown in Table 1.

Example 3

The test conducted in Example 1 was repeated, but using Epikote YL980 (product of Yuka Shell Epoxy, Ltd.; epoxy equivalents=189) instead of Epikote 154 as the glycidyl group-containing epoxy resin.

Comparative Examples 1–3

The same test was conducted as in Example 1, but for Comparative Example 1 the cycloaliphatic epoxy resin (GT401) was not included, for Comparative Example 2 the cationic polymerization retarder (N,N-diethyl-m-toluidine) was not included and for Comparative Example 3 the glycidyl group-containing epoxy resin (Epikote 154) was not included.

TABLE 1

| Component (g) | | Example 1 | Example 2 | Example 3 | Comp. Ex. 1 | Comp. Ex. 2 | Comp. Ex. 3 |
|---|---|---|---|---|---|---|---|
| Cycloaliphatic epoxy resin | GT401 | 4 | 4 | 4 | 0 | 4 | 5 |
| Glycidyl group-containing epoxy resin | Epikote 154 | 1 | 1 | 0 | 5 | 1 | 0 |
| | Epikote YL980 | 0 | 0 | 1 | 0 | 0 | 0 |
| Thermoplastic elastomer | A1020 | 5 | 5 | 5 | 5 | 5 | 5 |
| Ultraviolet activatable cationic polymerization catalyst | Irgacure 261 | 0.072 | 0.072 | 0.072 | 0.072 | 0.072 | 0.072 |
| Cationic polymerization retarder | N,N-diethyl-m-toluidine | 0.022 | 0.033 | 0.022 | 0.022 | 0 | 0.022 |
| Maximum electrical resistance (mΩ) | Normal — Immediate after bonding | 350 | 331 | 322 | 328 | 333 | 329 |
| | 85° C.-85% RH | 342 | 344 | 332 | ≧1000 | 344 | 340 |
| | RT60 min — Immediate after bonding | 333 | 332 | 326 | 331 | ≧1000 | ≧1000 |
| | 85° C.-85% RH | 345 | 343 | 340 | ≧1000 | ≧1000 | ≧1000 |

The results shown in Table 1 demonstrate that the anisotropically conductive adhesive films of the invention have working life of at least 60 minutes after ultraviolet activation, and that test strips formed using those adhesive films have excellent connection stability. On the other hand, the test strip formed using an adhesive film obtained from a composition containing no cycloaliphatic epoxy resin exhibited insufficient heat/humidity resistance, and thus had low connection stability. The adhesive films obtained from compositions containing no glycidyl group-containing epoxy resin or cationic polymerization retarder exhibited low working life.

Effect of the Invention

The anisotropically conductive adhesive composition of the invention exhibits (1) a long shelf life at room temperature, (2) high production efficiency for adhesive films, since the curing reaction is not promoted at the high temperatures of adhesive film production, for example at a drying temperature of 80° C., (3) a sufficiently long availability after activation until thermocompression bonding, thus providing the sufficient time required for the thermocompression bonding procedure, in consideration of the maintenance time, etc. in the semiconductor device mounting step for actual use, (4) rapid curability at a low temperature of about 100–130° C. during thermocompression bonding after ultraviolet activation, and (5) excellent mutual connection stability after connection between substrates.

We claim:

1. An anisotropically conductive adhesive composition comprising an epoxy resin comprising a cycloaliphatic epoxy resin and a glycidyl group-containing epoxy resin, an ultraviolet activatable cationic polymerization catalyst and a cationic polymerization retarder, and conductive particles.

2. The composition of claim 1 wherein the composition has a working life of at least about 10 minutes, and/or can be completely thermoset within about 60 seconds at a bonding temperature of about 100 to about 130° C.

3. The composition of claim 1 wherein the cycloaliphatic epoxy resin to glycidyl group-containing epoxy resin weight ratio is about 20:80 to about 98:2.

4. The composition of claim 1 further comprising a thermoplastic elastomer or resin.

5. The composition of claim 4 wherein the thermoplastic elastomer or resin is a styrene-butadiene-styrene block copolymer, and optionally comprises an amount of about 10 to about 900 parts by weight with respect to 100 parts by weight of the epoxy resin.

6. The composition of claim 1 wherein the ultraviolet activatable cationic polymerization catalyst is an iron-arene complex.

7. The composition of claim 1 wherein the cationic polymerization retarder is a toluidine.

8. The composition of claim 1 wherein the ultraviolet activatable cationic polymerization catalyst is cumene-cyclopentadienyl iron (II) hexafluorophosphate or xylene-cyclopentadienyl iron (II)-tris(trifluoromethylsulfonyl)methanide and the cationic polymerization retarder is N,N-diethyl-meta-toluidine.

9. The composition of claim 1 wherein the cycloaliphatic epoxy resin has about 90 to about 500 epoxy equivalents and the glycidyl group-containing epoxy resin has about 170 to about 5500 epoxy equivalents.

10. An anisotropically conductive adhesive composition according to claim 4, which comprises an epoxy resin wherein the cycloaliphatic epoxy resin to glycidyl group-containing epoxy resin weight ratio of the epoxy resin is about 20:80 to about 98:2, a thermoplastic elastomer or resin at about 10 to about 900 parts by weight with respect to 100 parts by weight of said epoxy resin, an ultraviolet activatable cationic polymerization catalyst at about 0.05 to about 10 parts by weight with respect to 100 parts by weight of said epoxy resin, and a cationic polymerization retarder at about 0.01 to about 10.0 equivalents with respect to said ultraviolet cationic polymerization catalyst.

11. The composition of claim 1 further comprising a reaction accelerator.

12. The composition of claim 1 further comprising a coupling agent.

13. The composition of claim 1 wherein the conductive particles are included at about 0.1 to about 30% by volume with respect to the total volume of the anisotropically conductive adhesive composition minus the conductive particles.

14. The composition of claim 1 wherein the conductive particles have a mean particle size of about 2 to about 40 $\mu$m.

15. An anisotropically conductive adhesive film obtained by coating and drying a coating solution comprising the anisotropically conductive adhesive composition of claim 1.

16. An anisotropically conductive adhesive composition comprising conductive particles and the reaction product of an epoxy resin comprising a cycloaliphatic epoxy resin and a glycidyl group-containing epoxy resin, an ultraviolet activatable cationic polymerization catalyst and a cationic polymerization retarder.

17. A method of connecting substrates comprising a. providing a first substrate;

b. providing an anisotropically conductive adhesive composition comprising conductive particles and an epoxy resin comprising a cycloaliphatic epoxy resin and a glycidyl group-containing epoxy resin, an ultraviolet activatable cationic polymerization catalyst and a cationic polymerization retarder;

c. exposing the adhesive composition to ultraviolet radiation to provide an activated adhesive film having an exposed surface;

d. positioning a second substrate on the exposed surface; and e. bonding the substrates via thermocompression.

18. The method of claim 17 wherein the adhesive composition is provided on a support.

19. The method of claim 18 wherein the ultraviolet radiation is directed through the support.

20. The method of claim 17 wherein the adhesive composition further comprises a reaction accelerator and/or a coupling agent.

* * * * *